United States Patent
Samittier Marti et al.

(10) Patent No.: US 6,876,174 B1
(45) Date of Patent: Apr. 5, 2005

(54) METHOD FOR DYNAMICALLY MEASURING THE STATE OF HEALTH AND CHARGE OF A CAR BATTERY AND DEVICE FOR IMPLEMENTING SAID METHOD

(75) Inventors: Josep Samittier Marti, Barcelona (ES); Manuel Puig Vidal, Igualada (ES); Oscar Ruiz Sanchez, Barcelona (ES); Daniel Guasch Murillo, Valls (ES); Jordi Bigorra Vives, Valls (ES); Jordi Giro Roca, Valls (ES)

(73) Assignee: Lear Automotive (EEDS) Spain, S.L., Tarragona (ES)

( * ) Notice: Subject to any disclaimer, the term of this patent is extended or adjusted under 35 U.S.C. 154(b) by 0 days.

(21) Appl. No.: 10/169,128

(22) PCT Filed: Dec. 31, 1999

(86) PCT No.: PCT/ES99/00414

§ 371 (c)(1),
(2), (4) Date: May 23, 2003

(87) PCT Pub. No.: WO01/50149

PCT Pub. Date: Jul. 12, 2001

(51) Int. Cl.$^7$ ........................ H01M 10/44; H01M 10/46
(52) U.S. Cl. ........................................ 320/132
(58) Field of Search .............................. 320/128, 132, 320/149; 324/426, 430, 433

(56) References Cited

U.S. PATENT DOCUMENTS

| | | | |
|---|---|---|---|
| 4,816,768 A | 3/1989 | Champlin | |
| 5,862,515 A | 1/1999 | Kobayashi et al. | |

FOREIGN PATENT DOCUMENTS

| | | |
|---|---|---|
| WO | WO 94/15222 | 7/1994 |

*Primary Examiner*—Edward H. Tso
(74) *Attorney, Agent, or Firm*—Sughrue Mion, PLLC

(57) ABSTRACT

Based on the measurement of the increase of sinusoidal voltage $\Delta V = V_{max} \sin(2\pi ft)$ on adding a sinusoidal current $\Delta I = I_{max} \sin(2\pi ft + \phi)$ to the battery current, where f is the frequency and $I_{max}$, the amplitude of the superimposed current, with whose magnitudes the electrochemical impedance of the battery $Z(f) = V_{max}/I_{max} e^{j\phi}$ is calculated, comprising the application of a first sinusoidal signal of prefixed frequency to the battery which generates an alternate voltage component superimposed over the direct one; eliminating the direct component of the response signal; applying a second periodic voltage signal with a frequency identical to that of said first signal and carrying out a synchronous detection of the alternate component generated by the application of said first signal to obtain the voltage proportional to the electrochemical impedance and evaluate the state of health and charge of the battery.

6 Claims, 2 Drawing Sheets

METHOD FOR DYNAMICALLY MEASURING THE STATE OF HEALTH AND CHARGE OF A CAR BATTERY AND DEVICE FOR IMPLEMENTING SAID METHOD

This application is a 371 of PCT/ES99/00414, filed Dec. 31, 1999. The disclosure of which is incorporated herein by reference.

FIELD OF THE INVENTION

The present invention refers to a method for the dynamic measurement of the state of health (SOH), that is, the maximum possible capacity of a battery or real capacity after recharging, as well as the state of charge (SOC) of a vehicle battery or the real capacity that may be provided during immediate discharge.

When referring to a battery or battery component/unit, it will be understood in this specification as a secondary battery (reversible electrochemical action) or accumulator and particularly, a battery for a motor vehicle.

The electric system of a motor vehicle or automobile is a vital part of its operation. The battery, as an energy storage component, is a key factor in the development of electric systems with intelligent management capacity (microprocessors and management algorithms). These systems are necessary due to the significant increase in the demands for electric power in automobiles. The batteries of modern automobiles are specifically designed to provide high levels of current for coupled starting motors with a comparatively small reserve capacity, to confront inactive charges and emergency functions when the charging circuit fails. A suitable voltage adjustment is not only necessary for protection of the system charges, but for correct operation and long battery life.

The process of this invention uses an impedance measurement method called electrochemical impedance spectroscopy (or impedance in alternate current) based on the measurement of the increase of the sinusoidal voltage $\Delta V = V_{max} \sin(2\pi f t)$ when adding a sinusoidal current $\Delta I = I_{max} \sin(2\pi f t + \phi)$ to the normal charging and discharging current of the battery, where f is the frequency and $I_{max}$, the amplitude of the superimposed sinusoidal current, with whose magnitudes, the electrochemical impedance of the battery $Z(f) = V_{max}/I_{max}$ is calculated.

As a result, the electrochemical impedance of a battery is a complex number depending on frequency, characterised both by its real and imaginary parts or by its modulus $|Z| = V_{max}/I_{max}$ and its phase angle $\phi$.

The invention concerns a dynamic method, that is, it is not necessary to implement it in a laboratory or workshop, as it may be applied over the vehicle itself, whether at rest, before starting the engine or during operation, providing a preventive or useful indication for the possible intelligent management of the vehicle electrical system.

Likewise, the invention proposes a device permitting the determination of significant parameters derived from the measurement of said electrochemical impedance dynamically, that is, over the vehicle and which may eventually include a connection box with intelligent management. Also, said device implemented in some electronic circuits is simple, so that its cost is very reasonable and its operation is safe.

BACKGROUND OF THE INVENTION

The main problem for the methodology indicated by this invention is the precision of the on-line SOC determination and SOH evolution. The measurement of battery voltage is an unsuitable parameter to establish a good correlation with the battery SOH. It is known that the only reliable process to detect premature capacity failures in batteries is the discharge test at a constant current and a specific voltage. However, this method is expensive, requires a lot of time and cannot be implemented for dynamic management.

SOC and SOH determination of batteries subject to different discharge cycles, have been widely used in the last two decades for the research of battery component/unit kinetics. In these previous studies, like "A review of impedance measurements for determination of the state-of-charge or state-of-health of secondary batteries". F. Huet. Journal of Power Sources 70, pp 59–69, (1998), many authors have concluded that impedance methods are a good method to provide a SOC test.

The modulus representations and the phase of said electrochemical impedance in relation to the frequency by means of Bode diagrams are usual in the characterisation of electronic circuits, although the most common representation in the field of batteries is the Nyquist diagram, which relates the imaginary part with the real part of said impedance.

The main common features of the Nyquist diagrams applied to automobile batteries, particularly those of lead-acid are:

an inductive part at frequencies greater than 100 Hz;

a high frequency resistance $R_{HF}$ in the $m\Omega$ range being the real part of the impedance at frequencies greater than 100 Hz;

a first and small capacitive loop for frequencies between 0.1 to 100 Hz;

a second and wider capacitive loop for frequencies greater than 0.1 Hz.

Therefore, the SOC and SOH of batteries subject to different charge-discharge cycles have been characterised in the laboratory by impedance measurements. Some of the parameters extracted from the $R_{HF}$ spectrum, for example, are directly related to the battery SOC. Moreover, the ohmic resistance $R_{HF}$ of the impedance measurement at high frequencies, is a strong parameter that may be included in a dynamic, "on-line" determination, carried out on the vehicle, for the battery safety regions.

A very common study method of properties depending on frequency consists of modelling the unknown system by means of an equivalent electric circuit. In this context, the following publication may be mentioned: "Dynamic modelling of lead/acid batteries using impedance spectroscopy for parameter identification". P. Mauracher, E. Karden. Journal of Power Sources 67, pp 69–94 (1997).

Methods and devices or systems for a controlled management of batteries appear in patents WO-A-98/53335 regarding a SOH control system of a battery, EP-A-884600, referring to a device and method to control the SOC of a battery and patent WO-A-98/58270 which refers to a method and apparatus to evaluate and classify batteries, based on the application of microcharges or charge micropulses to the battery, making the classification according to the resulting voltage profiles, or portions thereof, taken at the battery terminals.

U.S. Pat. No. 5,773,978 concerns impedance control for a storage battery including a charge circuit coupled to the terminals of a battery to charge it, so that a voltage component is generated in its posts depending on the time it has a peak to peak amplitude, the measuring unit connected to the battery posts including a peak detector to generate an indicative voltage based on the impedance unit output.

All these systems and particularly that described in the last mentioned patent, are not sufficiently suitable for a measurement and eventual later dynamic management in the automobile itself, since to the battery terminals are connected different charges and sources which would also introduce their components in the output signal, as from which impedance should be measured, hindering measurement precision and making it unreliable.

BRIEF DESCRIPTIONS OF THE INVENTION

Contrary to the mentioned background, in the present invention it is proposed to carry out a synchronous detection of the alternate voltage signal, proportional to the battery impedance generated in the posts thereof, as a consequence of the injection of current, such that all the components that could introduce other charges or sources connected to the battery are eliminated and only the voltage proportional (modulus and phase) to the electrochemical impedance of the battery is obtained.

More specifically, the method according to the invention comprises the following stages:

application of a first sinusoidal current signal of a prefixed frequency to the battery posts, generating a voltage response in said terminals as an alternate voltage component superimposed over the direct current, together with other alternate voltage components generated by different electric and electronic devices supplied by said battery and/or connected to it;

elimination of the continuous component of the response signal, leaving only the alternate voltage components;

application of a second high precision voltage signal, for reference, having an identical frequency to that of the mentioned first sinusoidal current signal and execution of a synchronous detection of the alternate voltage component generated by the application to the battery terminals of that first sinusoidal current signal to only obtain a voltage proportional (modulus and phase) to the electrochemical impedance of the battery; and evaluation as from said electrochemical impedance value, at any moment of battery operation in the vehicle, of the state of health and state of charge of the battery, by comparing with module/frequency diagrams preanalysed and stored in memory.

The features and advantages of the invention will be explained with greater detail in the light of the following drawings:

DETAILED DESCRIPTION OF SOME EXAMPLES OF EMBODIMENTS

Figure 1:
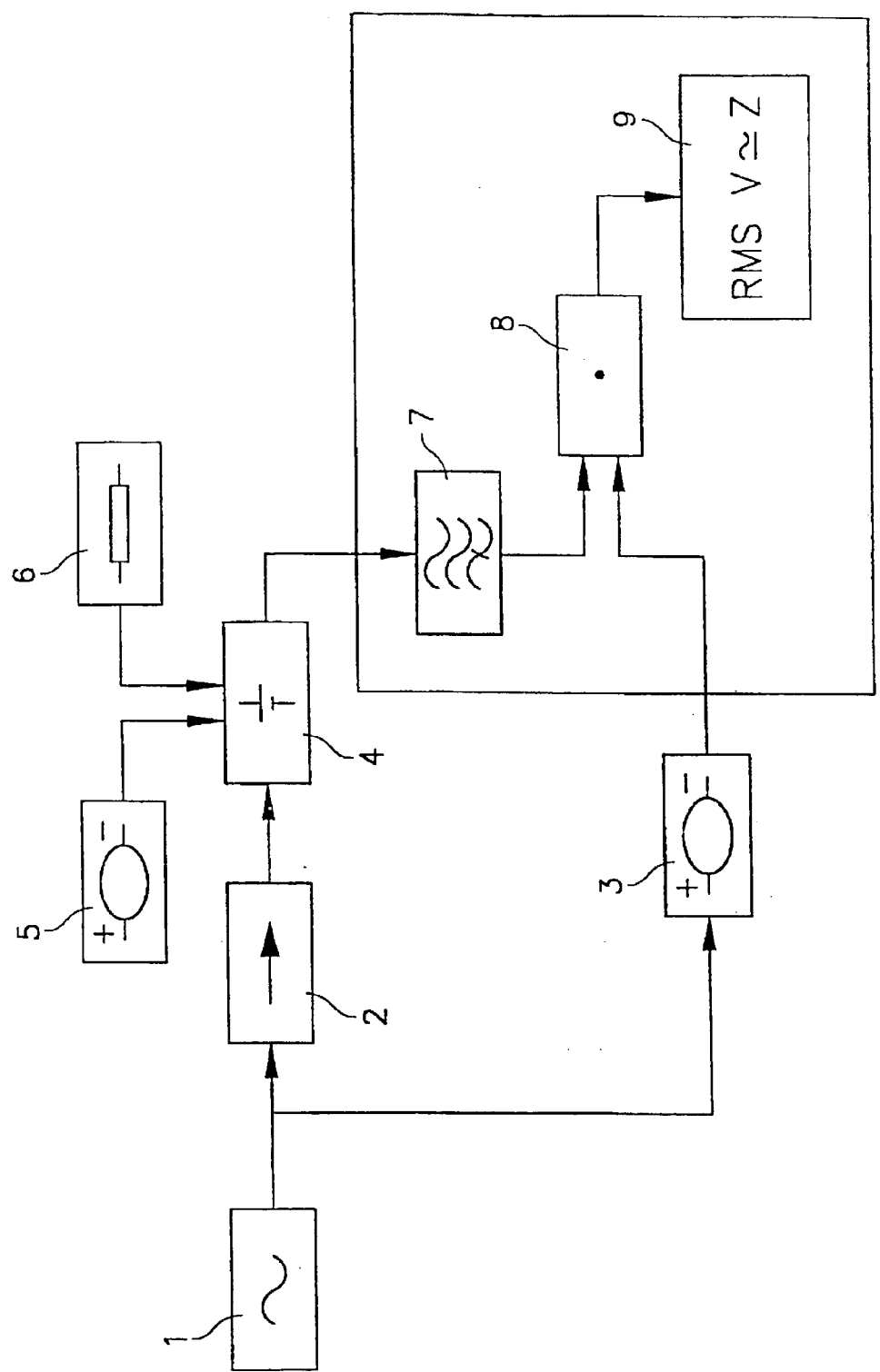
FIG. 1 is an explanatory schematic diagram of the principle on which the process and device is based, according to the invention and the functional blocks that may participate in it.

According to the diagram shown in FIG. 1, a power unit 1 is indicated with a high precision sinusoidal wave form to which blocks 2 are immediately related operationally, representative of a current source and 3 corresponding to a voltage source or reference signal of identical frequency to that of the power unit 1. The current source 2 attacks the battery 4, to which in turn are connected, one or more sources 5 and different charges 6 of the electric system and automobile networks. The response signal in the battery 4 terminals or posts, in the form of an alternate voltage component superimposed over the direct voltage, together with other alternate voltage components generated by different electric and electronic devices supplied by and/or connected to said battery are applied to block 7 to eliminate the direct current component and then, the resulting signal is introduced in block 8 for synchronous detection, to which the signal coming from the mentioned voltage source of reference 3 also accesses. The resulting signal is filtered in block 9, so that only voltage (modulus and phase) is obtained proportional to the electrochemical impedance of the battery, provided that the addition alternate voltage components that had been able to enter the battery terminals had been eliminated in said precision synchronous detection process.

Figure 2:
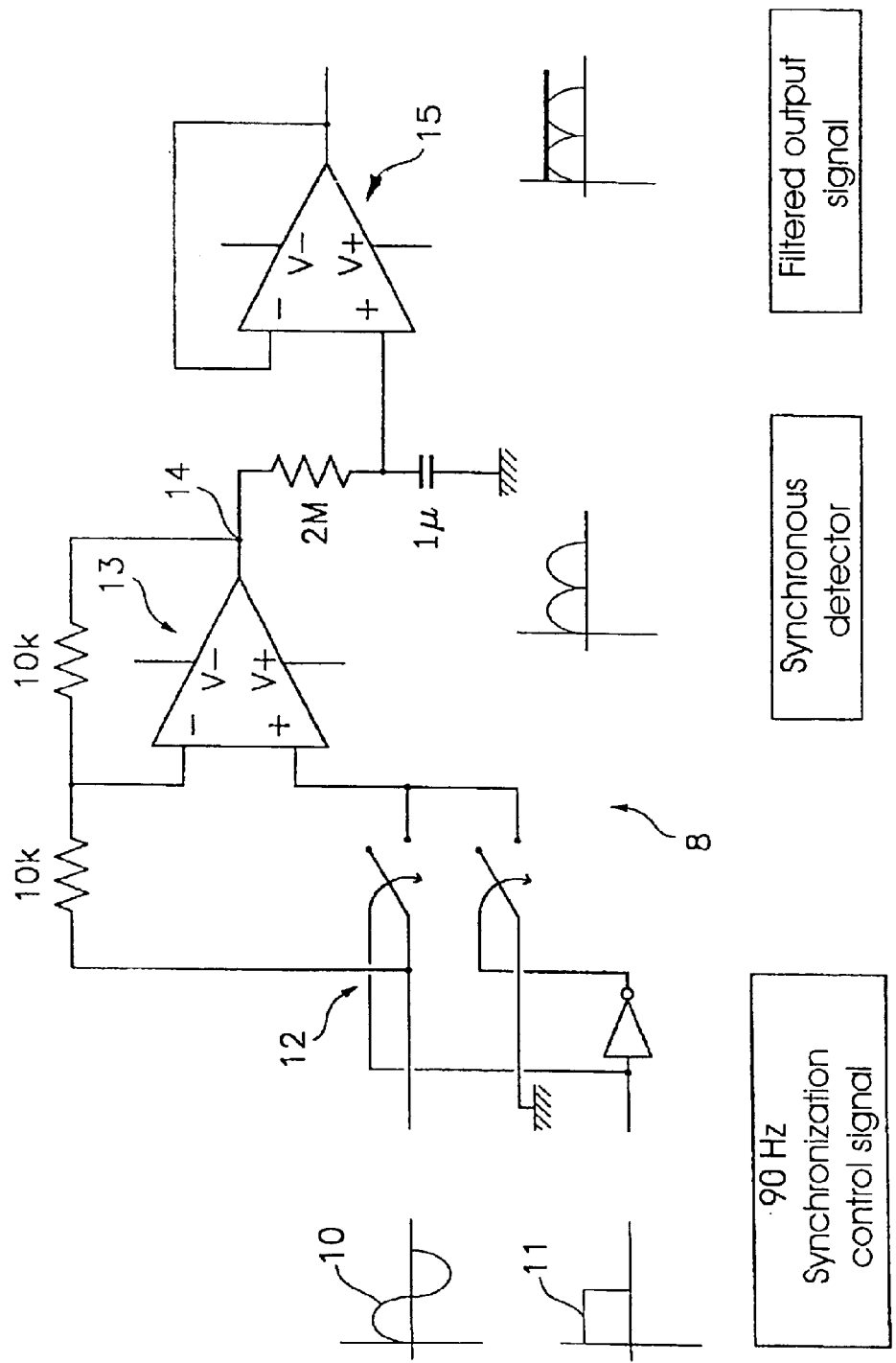
FIG. 2 shows a simplified diagram of the proposed device using some switching blocks for a synchronous demodulation, essential to understand the process operation.

The power unit precision with wave shape 1 is related to the level of detection precision, values in the range of mHz being typical. In FIG. 2, which corresponds to the synchronous detection and filtering phase stage, it is observed that the input signals 10, including the signal of interest at the reference frequency fr=90 Hz, together with noise and interference are applied to the input of the synchronous detection block 8. The input signals are mixed with an internally developed signal, derived from the reference signal of the voltage source 3, by the control power unit block.

Output 11 of the power unit block for signal control obtained from the voltage source reference signal 3 is applied to the other synchronous detection block 8 input. This block 8 has a response almost in resonance corresponding to an extremely narrow band amplifier. Hence, beyond the very narrow detection band, the response is eliminated, providing significant attenuation of the input frequencies not consistent with the reference frequency.

As has been indicated, the simplified diagram of FIG. 2 shows the use of some switching blocks 12 for synchronous demodulation.

The signal source 10 coming from the battery after elimination of the direct current component is amplified by using a differential pre-amplifier 13 based on an instrumentation amplifier configuration. Output 14 of the instrumentation amplifier includes the desired input frequency together with the noise.

The synchronised switching block by zero crossing of the control generator block with the reference input frequency causes a gain amplification change between plus one and minus one. The rectified signal is filtered in 15 to remove the desired signal amplitude, hence generating the RMS value. As a result of this signal processing, the instrumentation amplifier signal output has been synchronically demodulated in this block 8. The reference frequency value has been selected to minimise the phase shifts induced by the reactance value of the battery impedance. However, the gain is maximised by adjusting the phase between the control reference signal and the input signal.

What is claimed is:

1. A method for a dynamic measurement of the state of health and charge of a vehicle battery, based on the measure of sinusoidal voltage increase $\Delta V = V_{max} \text{sine}(2\pi ft)$ when a sinusoidal current, $\Delta I = I_{max} \text{sine}(2\pi ft + \phi)$ is added to the normal charge and discharge current of the battery, where f is the frequency and $I_{max}$, the amplitude of the superimposed sinusoidal current, by whose magnitudes the electrochemical impedance of the battery $Z(f) = V_{max}/I_{max} e^{j\phi}$ is calculated, characterised on comprising the following stages:

Application of a first sinusoidal current signal of a prefixed frequency to the battery terminals, generating a voltage response in said terminals as an alternate voltage component superimposed over the direct current, together with other alternate voltage components generated by different electric and electronic devices supplied by said battery and/or connected to it;

elimination of the continuous component of the response signal leaving only the alternate voltage components;

application of a second high precision voltage signal, for reference, having an identical frequency to that of the mentioned first sinusoidal current signal and execution of a synchronous detection of the alternate voltage component generated by the application to the battery terminals of that first sinusoidal current signal to only obtain a voltage proportional (modulus and phase) to the electrochemical impedance of the battery, and evaluation as from said electrochemical impedance value, at any moment of battery operation in the vehicle, of the state of health and state of charge of the battery, by comparing with modulus/frequency diagrams pre-analysed and stored in memory for different types of battery.

2. A method according to claim 1, characterised in that the mentioned stage of synchronous detection comprises the application of those alternate voltage components of the battery terminals and a second high precision periodic voltage signal to an amplification and frequency discrimination assembly.

3. A method according to claim 2, characterised in that said amplification and frequency discrimination assembly comprises a multiplier and a low-pass filter generating in its output a third periodic voltage signal, proportional to the elctrochemical impedance of the battery.

4. A method according to claim 1, characterised in that the mentioned sinusoidal signal applied in the form of current and the mentioned second periodic high precision reference voltage signal are obtained from a power unit with a single high precision sinusoidal wave shape.

5. A device for the dynamic measurement of the state of health and charge of a vehicle battery, based on the measurement of the increase of sinusoidal voltage $\Delta V = V_{max} \text{sine}(2\pi ft)$ when a sinusoidal current $\Delta I = I_{max}\text{sine}(2\pi ft + \phi)$ is added to the normal charge and discharge current of the battery, where f is the frequency and $I_{max}$, the amplitude of the superimposed sinusoidal current, by whose magnitudes the electrochemical impedance of the battery $Z(f) = V_{max}/I_{max}e^{j\phi}$ is calculated, characterised on comprising a generating device of high precision sinusoidal wave form which controls a current source foreseen to apply a first sinusoidal current signal, with a frequency corresponding to said wave form power unit, to the terminals of the battery and a multiplication and frequency amplification assembly to which is supplied the voltage in said battery terminals and a reference voltage signal coming from said sinusoidal wave form power unit, for the synchronous detection in said multiplier and filter assembly, of the alternate voltage component generated by the application of that first sinusoidal current signal to the battery terminals.

6. A method according to claim 5, characterised in that said amplification and frequency discrimination assembly comprises a multiplier and a low-pass filter generating at its output a third periodic voltage signal, proportional to the electrochemical impedance of the battery.

* * * * *